United States Patent [19]
Dow et al.

[11] Patent Number: 5,926,052
[45] Date of Patent: Jul. 20, 1999

[54] VARIABLE PHASE SHIFTER AND METHOD

[75] Inventors: Stephen W. Dow, Austin, Tex.; Jeffrey C. Durec; David K. Lovelace, both of Chandler, Ariz.

[73] Assignee: Motorola, Inc., Schaumburg, Ill.

[21] Appl. No.: 08/908,827

[22] Filed: Aug. 8, 1997

Related U.S. Application Data

[63] Continuation-in-part of application No. 08/673,588, Jul. 1, 1996, abandoned.

[51] Int. Cl.⁶ .............................. H03H 11/16; H03K 3/00
[52] U.S. Cl. ............................................. 327/234; 327/254
[58] Field of Search ...................................... 327/147, 149, 327/153, 155, 156, 158, 159, 163, 231, 234–238, 243, 244, 246, 250, 254, 255, 256, 278, 281, 336, 345, 491, 131–134, 295; 332/103; 329/304

[56] References Cited

U.S. PATENT DOCUMENTS

| | | | |
|---|---|---|---|
| 3,322,973 | 5/1967 | Baldwin | 327/254 |
| 3,761,829 | 9/1973 | Spaulding | 329/104 |
| 4,394,626 | 7/1983 | Kurihara et al. | 331/12 |
| 4,782,246 | 11/1988 | Kuroyanagi et al. | 327/236 |
| 4,866,397 | 9/1989 | Kimyacioglu | 327/246 |
| 5,179,731 | 1/1993 | Trankle et al. | 455/291 |
| 5,189,313 | 2/1993 | Garuts | 327/131 |
| 5,216,302 | 6/1993 | Tanizawa | 327/250 |
| 5,285,120 | 2/1994 | Landt | 327/255 |
| 5,337,022 | 8/1994 | Pritchett | 331/1 A |
| 5,375,258 | 12/1994 | Gillig | 455/87 |
| 5,438,301 | 8/1995 | Havens et al. | 331/45 |
| 5,543,742 | 8/1996 | Takeda et al. | 327/238 |
| 5,629,652 | 5/1997 | Weiss | 331/108 B |
| 5,644,260 | 7/1997 | DaSilva et al. | 327/238 |

FOREIGN PATENT DOCUMENTS

| | | | |
|---|---|---|---|
| 361157019 | 7/1986 | Japan | 327/254 |
| 362135008 | 6/1987 | Japan | 327/255 |
| 2239141 | 6/1991 | United Kingdom | 327/254 |

*Primary Examiner*—My-Trang Nu Ton
*Attorney, Agent, or Firm*—Sharon K. Coleman; Gary Hoshizaki

[57] ABSTRACT

A circuit and method for producing a phase shifted quadrature signal (VOUT) from an in-phase signal (VIN). The in-phase signal (VIN) is applied to the control electrode of a voltage follower (121). The voltage follower (121) has a variable output resistance which combines with a capacitor (123) to delay the input signal (VIN) in accordance with the time constant formed by the variable output resistance and the capacitor (123). The variable output resistance is controlled by adjusting the bias current of the voltage follower (121) with a control signal.

13 Claims, 1 Drawing Sheet

VARIABLE PHASE SHIFTER AND METHOD

This application is a continuation-in-part of prior application Ser. No. 08/673,588, filed Jul. 1, 1996, now abandoned.

BACKGROUND OF THE INVENTION

The present invention relates in general to communications circuits and, more particularly, to modulator and demodulator circuits.

Wireless communications systems commonly use both an in-phase and a quadrature signal in modulating or demodulating information on a radio frequency carrier signal. In-phase and quadrature signals are used in such diverse applications as satellite receivers, cellular and cable telephone systems, global positioning systems and cable television set-top boxes. These applications operate at high frequencies between 500 megahertz and 3 gigahertz. A quadrature signal is one which is 90 degrees shifted in phase with respect to an in-phase signal.

Accurate modulation or demodulation depends on the in-phase signal and quadrature signals having a small quadrature phase error and a constant amplitude. These goals are difficult to achieve at higher frequencies, however, because circuit parasitics and signal propagation delays have a greater effect at high frequencies. The result is either a more complex circuit or lower performance of the modulator or demodulator.

A previously known method generates the quadrature signal passively by applying the in-phase signal to a resistor-capacitor network. The network shifts the phase of the in-phase signal by 90 degrees, thereby producing the quadrature signal. However, this method is inadequate for systems which are tuned over a frequency range because the amplitude of the quadrature signals varies severely over the range. Another passive method using a tank circuit reduces amplitude variations by tuning the tank circuit with variable reactance devices such as varactor diodes. However, varactor diodes require large tuning voltage variations which are difficult to provide on a low voltage integrated circuit.

A digital method uses an input signal at twice the frequency of the desired in-phase and quadrature signals. A divide-by-two frequency divider generates the in-phase and quadrature signals from the input signal. However, the high input frequency makes this method impractical for high frequency applications. Another disadvantage is that the resulting quadrature signal does not have a fifty percent duty cycle so that additional signal processing is needed to produce a quadrature signal having a fifty percent duty cycle.

There is a need for a circuit and a method for accurately generating a quadrature signal over a range of high frequencies which reduces the amplitude variation in the quadrature signal. It would be a benefit if the method and circuit produced a quadrature signal without the need for additional circuitry to provide a fifty percent duty cycle in the quadrature signal. It would be a further benefit if large bias voltages were not required for tuning variable reactance devices so that the quadrature signal could be integrated on a semiconductor die with a minimum of external circuitry.

DETAILED DESCRIPTION OF THE DRAWING

Quadrature signals are signals which are 90 degrees apart in phase with respect to each other. In wireless communications systems, both in-phase and quadrature signals are used in modulating or demodulating radio frequency carrier signals. Many of these systems operate over a range of carrier frequencies between 500 megahertz and 3 gigahertz.

In applications where power conservation is a primary factor, power consumption is reduced by suppressing the carrier frequency and transmitting only a single sideband, which contains the information needed for recovering the modulating signal from the transmitted signal. The carrier frequency is typically regenerated at the receiver end with an oscillator whose output serves as the in-phase signal. The quadrature signal is derived by phase shifting the in-phase signal. Minimizing transmission at the carrier frequency depends on the accuracy of the quadrature relationship between the in-phase and quadrature signals. Accurate quadrature is also needed to prevent unwanted image frequencies from interfering with receiver performance. A deviation in quadrature of one degree of phase is generally considered acceptable.

The present invention uses a delay locked loop and a variable phase shifting circuit to dynamically produce a quadrature signal from an in-phase signal. A tank circuit is not required. The delay locked loop produces a quadrature signal over a range of frequencies, and thus can be used in applications that require tuning over a frequency range. Variations in amplitude of the quadrature signal as the in-phase signal is tuned are significantly reduced as compared with previously known methods. Amplitude variations of ten percent or less are generally considered acceptable. The resulting quadrature signal has a fifty percent duty cycle and is readily incorporated as an integrated circuit.

In operation, the in-phase signal is phase shifted using a capacitor and a variable resistance, which provide an effective resistor-capacitor (RC) time constant for phase shifting the in-phase signal. The relative phase of the in-phase and quadrature signals is sensed in a phase detector, whose output signal corresponds to the relative phase. A control signal derived from the phase detector is fed back to adjust the variable resistance such that a 90 degree phase shift is provided in the quadrature signal.

Figure 1:
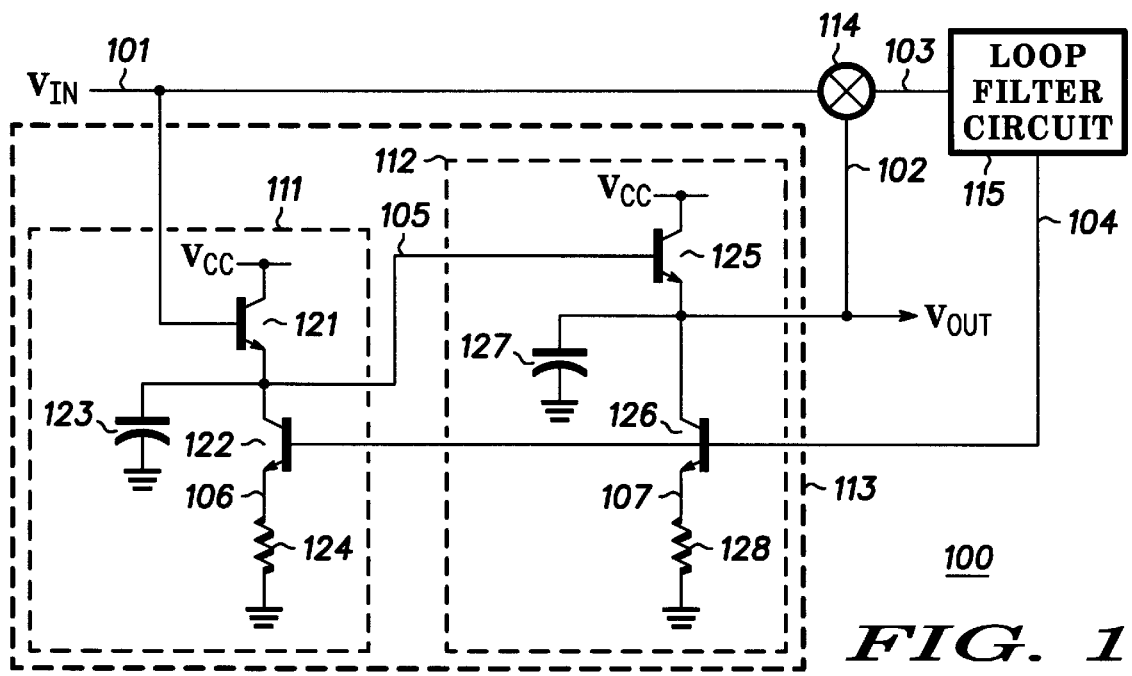
FIG. 1 is a schematic diagram of a delay locked loop circuit.

FIG. 1 is a schematic diagram of a delay locked loop circuit 100 in accordance with the present invention. Delay locked loop circuit 100 has an input terminal 101 which receives an input signal $V_{IN}$ and an output terminal 102 which provides a phase shifted quadrature signal $V_{OUT}$. Delay locked loop circuit 100 is comprised of a phase shifting circuit 113, a phase detector circuit 114 and a loop filter circuit 115. Phase shifting circuit 113 has an input connected to input terminal 101 of delay locked loop circuit 100, a control input terminal 104 and an output which serves as output terminal 102 of delay locked loop circuit 100. Phase detector circuit 114 has an input connected to terminal 101, an input connected to output terminal 102 and an output terminal 103 which provides a detection signal $V_{DETECT}$. Loop filter circuit 115 has an input connected to terminal 103 and an output connected to terminal 104. Loop filter circuit 115 produces a control signal $V_{CONTROL}$ at its output.

Phase shifting circuit 113 is also referred to as an integrated variable phase shifting circuit. It is comprised of delay stages 111 and 112. Delay stage 111 has an input connected to input terminal 101 of delay locked loop circuit 100, an output terminal 105 and a control input connected to terminal 104. It is comprised of transistors 121 and 122, capacitor 123 and resistor 124. Transistor 121 has a base connected to terminal 101, an emitter connected to output terminal 105 and a collector connected to a power supply terminal for receiving a power supply voltage such as $V_{cc}$. Transistor 122 has a base connected to terminal 104, an emitter connected to terminal or node 106 and a collector connected to output terminal 105. Capacitor 123 is connected between output terminal 105 and a power supply terminal for receiving a power supply voltage such as ground. Resistor 124 is connected between node 106 and a power supply voltage such as ground.

Delay stage 112 has an input connected to terminal 105, a control input connected to terminal 104 and an output terminal which serves as the output of delay locked loop circuit 100. It is comprised of transistors 125 and 126, capacitor 127 and resistor 128. Transistor 125 has a base connected to terminal 105, an emitter connected to output terminal 102 and a collector connected to a power supply voltage such as $V_{cc}$. Transistor 126 has a base connected to terminal 104, an emitter connected to terminal or node 107 and a collector connected to output terminal 102. Capacitor 127 is connected between output terminal 102 and a power supply voltage such as ground. Resistor 128 is connected between node 107 and a power supply voltage such as ground.

In operation, input signal $V_{IN}$ drives the base of transistor 121, which is operated as a voltage follower, also called an emitter follower. Transistor 122 cooperates with resistor 124 to form a current source which supplies a bias current to the emitter of transistor 121 whose magnitude is adjusted by control signal $V_{CONTROL}$. Although control signal $V_{CONTROL}$ is shown and described as a voltage signal, in an alternative embodiment control signal $V_{CONTROL}$ can be a current signal. The emitter of transistor 121 has a variable output resistance, $r_{e121}$, which corresponds to the emitter current in accordance with equation (1).

$$r_{e121} = (kT)/(qI_{e121}) \tag{1}$$

where k is Boltzmann's constant, T is the absolute temperature in degrees Kelvin, q is a unit electron charge and $I_{e121}$ is the emitter current of transistor 121. As indicated in equation (1), the dynamic output resistance of transistor 121 is varied by adjusting the bias current supplied to its emitter. A typical range for the emitter current of transistor 121 is between 100 microamperes and 1 milliampere, which at 25 degrees Celsius produces a variable output resistance $r_{e121}$ between 26 ohms and 260 ohms. Such low value resistors are needed to produce phase shifts at frequencies between 500 megahertz and 3 gigahertz which are used in wireless communications systems. Thus, by configuring transistor 121 as a voltage follower, an output resistance which has a low parasitic capacitance and a low value while being variable is produced economically.

Transistors are commonly understood to have first and second electrodes and a control electrode. For example, the first and second electrodes typically correspond to the collector and emitter of a bipolar transistor, respectively, and the control electrode corresponds to the base of the bipolar transistor. One skilled in the art could alternatively implement the present invention using other types of transistors. By way of example, an insulated gate field effect transistor (IGFET) can be used, in which case the first and second electrodes typically correspond to the drain and source of the IGFET, respectively, and the control electrode corresponds to the gate of the IGFET. It should be appreciated, however, that in such an alternative embodiment there may be a different relationship between the variable output resistance and bias current from the one described in equation (1).

Capacitor 123 cooperates with the dynamic output resistance re121 of transistor 121 to produce a time constant, TDELAY, which is given by $$T_{DELAY} = C_{123} * r_{e121} \tag{2}$$

where $C_{123}$ is the capacitance of capacitor 123. Thus, $T_{DELAY}$ is a function of $C_{123}$ and $r_{e121}$. As a result of the operation of time constant $T_{DELAY}$, the output signal appearing at output terminal 105 of delay stage 111 is delayed or phase shifted with respect to input signal $V_{IN}$. In accordance with equations (1) and (2), the magnitude of the delay or phase shift depends on the bias current supplied by the collector of transistor 122.

Capacitor 123 is generally an integrated, fixed value capacitor. In order to provide a small time constant $T_{DELAY}$, which is needed for producing a usable phase shift at frequencies between 500 megahertz and 3 gigahertz, its capacitance $C_{123}$ generally ranges between one-half and five picofarads, with a typical value of one picofarad. Capacitors in this range are readily integrated on a semiconductor die. The plates of capacitor 123 are preferably formed from a low resistance conductive material such as aluminum or another metal. This construction minimizes parasitic resistance, thereby improving the response of capacitor 123 to high frequencies. Alternate configurations for capacitor 123, such as varactor diodes, generally have higher parasitic resistances which limit their high frequency response. The plates are separated by silicon dioxide, silicon nitride, or another dielectric material Because time constant $T_{DELAY}$ consists of a single resistance and a single capacitance, it provides less than 90 degrees of phase shift. Recall that a quadrature signal is one having 90 degrees of phase shift relative to an in-phase signal. Because 90 degrees of phase shift cannot be reached with a single delay stage 111, a second delay stage 112 is used to provide an additional phase shift. The total phase shift produced by delay stages 111 and 112 is therefore a maximum of 180 degrees. The addition of a second delay stage 112 provides an added benefit of increasing the adjustment range around quadrature of phase shifting circuit 113. In one embodiment, delay stage 112 is comprised of components which have the same values as the corresponding components which comprise delay stage 111, each stage providing 45 degrees of phase shift to produce the desired cumulative 90 degrees of phase shift.

Delay stage 112 has an input connected to terminal 105, a control input connected to terminal 104 and an output terminal which serves as the output of delay locked loop circuit 100. It is comprised of transistors 125 and 126, capacitor 127 and resistor 128. Transistor 125 has a base connected to terminal 105, an emitter connected to output terminal 102 and a collector connected to a power supply voltage such as $V_{cc}$. Transistor 126 has a base connected to terminal 104, an emitter connected to terminal 107 and a collector connected to output terminal 102. Capacitor 127 is connected between output terminal 102 and a power supply voltage such as ground. Resistor 128 is connected between node 107 and a power supply voltage such as ground.

The operation of delay stage 112 is similar to the operation of delay stage 111. Transistor 125 is configured as a voltage follower which provides a variable output resistance at output terminal 102 corresponding to the emitter current of transistor 125. Transistor 126 cooperates with resistor 128 to form a current source which supplies a bias current to the emitter of transistor 125 for varying the output resistance. The magnitude of the bias current is adjusted by control signal $V_{CONTROL}$. The variable output resistance cooperates with capacitor 127 to produce a quadrature signal VOUT at output terminal 102 which is delayed or phase shifted in relation to the input signal applied at terminal 105. By way of example, at the frequencies used in wireless communications, capacitor 127 has a fixed capacitance which is typically one picofarad, with a range of between one-half and five picofarads.

The respective delays produced by delay stages 111 and 112 are summed to produce a cumulative phase shift in quadrature signal $V_{OUT}$. Thus, phase shifting circuit 113 is capable of providing a phase shift ranging from zero to 180 degrees.

Phase detector circuit 114 is commonly configured as a multiplier circuit, producing a detection signal $V_{DETECT}$ at its output terminal 103. Detection signal $V_{DETECT}$ corresponds to the product of input signal $V_{IN}$ and quadrature signal VOUT. By way of example, phase detector circuit 114 is configured as a well known doubly balanced multiplier circuit. The detection signal can be a single ended signal or, alternatively, a differential signal. It can be either a current signal or a voltage signal. Detection signal $V_{DETECT}$ provides a measure of the quadrature phase error, i.e., deviation in phase from true quadrature, between input signal $V_{IN}$ and quadrature signal $V_{OUT}$. When input signal $V_{IN}$ and quadrature signal VOUT are in true quadrature, detection signal $V_{DETECT}$ corresponds to zero quadrature phase error.

As a result of the multiplication of input signal $V_{IN}$ and quadrature signal $V_{OUT}$, detection signal $V_{DETECT}$ has a frequency component at twice the frequency of input signal $V_{IN}$. This frequency component may be attenuated by a filter contained in phase detector circuit 114 or may be attenuated in loop filter circuit 115.

Loop filter circuit 115 is typically configured as a low pass filter with a cutoff frequency for limiting the bandwidth of the delay locked loop circuit 100. Its input at terminal 103 receives detection signal $V_{DETECT}$ and its output provides control signal $V_{CONTROL}$. Loop filter circuit 115 attenuates component frequencies of detection signal $V_{DETECT}$ which are above the cutoff frequency, thereby providing a control signal $V_{CONTROL}$ which corresponds to an average quadrature phase error between input signal $V_{IN}$ and quadrature signal $V_{OUT}$. The cutoff frequency is typically selected after balancing the need for fast loop response against noise power and phase jitter. A higher cutoff frequency allows the delay locked loop circuit 100 to recover from a phase error more rapidly, while a lower cutoff frequency reduces loop noise and the associated phase jitter. For wireless communications applications operating at frequencies between 500 megahertz and 3 gigahertz, a cutoff frequency less than 50 megahertz is generally adequate. The circuit components of such a loop filter are readily integrated on a semiconductor die.

Control signal $V_{CONTROL}$ is a correction signal which is fed back to phase shifting circuit 113 for adjusting the voltage on the bases of transistors 122 and 126 when a quadrature phase error is detected. Control signal $V_{CONTROL}$ provides zero correction when input signal $V_{IN}$ and quadrature signal $V_{OUT}$ are in quadrature. If the phase of quadrature signal $V_{OUT}$ deviates from quadrature with respect to input signal $V_{IN}$, the negative feedback provided by $V_{CONTROL}$ adjusts the respective bias currents in transistors 121 and 125. The respective output resistances of transistors 121 and 125 are thereby adjusted, which alters the phase shift produced in phase shifting circuit 113 such that quadrature is restored.

Figure 2:
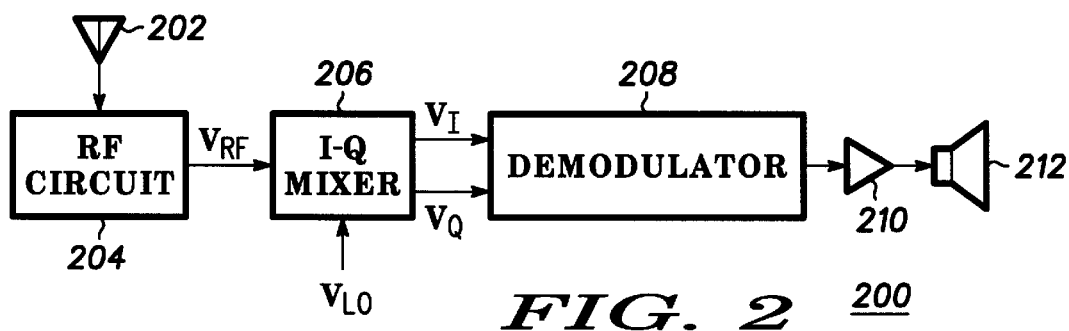
FIG. 2 is a block diagram of a wireless communications device.

FIG. 2 is a block diagram of a wireless communications device 200 such as a cellular telephone, two-way radio, or pager, including an antenna 202, a radio frequency (RF) circuit 204, an I-Q mixer circuit 206, a demodulator 208, an amplifier 210 and a speaker 212. A receiver circuit in communications device 200 includes antenna 202 which receives a transmitted RF carrier signal modulated with information such as an audio signal, and RF circuit 204 for amplifying the RF carrier signal to produce an amplified RF signal designated as $V_{RF}$. The RF carrier signal has a center frequency operating over a broad carrier frequency band ranging from 100–1500 megahertz, and can also be modulated with digital and other analog information. A local oscillator signal $V_{LO}$ is generated in a local oscillator (not shown) to operate in a frequency band from 90–1490 megahertz for tuning communications device 200.

I-Q mixer 206 downconverts $V_{RF}$ with $V_{LO}$ to produce an in-phase signal $V_I$ and a quadrature signal $V_Q$ which operate at an intermediate frequency (IF) of 10.0 megahertz, the frequency difference between $V_{RF}$ and $V_{LO}$. $V_I$ and $V_Q$ retain the modulation information of amplified RF signal $V_{RF}$ and have a quadrature phase relationship, i.e., are 90.0 degrees apart in phase.

A demodulator 208 uses $V_I$ and $V_Q$ to recover the audio signal, which is amplified by audio amplifier 210 for driving speaker 212. Demodulator 208 can also include tuning circuits for selecting a desired carrier frequency within the frequency band to extract both amplitude-modulated and phase-modulated signals from $V_I$ and $V_Q$.

Figure 3:
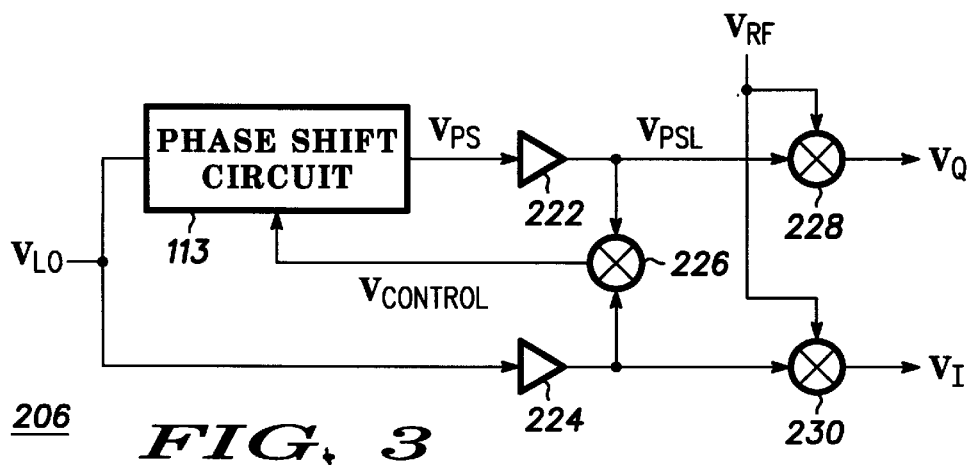
FIG. 3 is a block diagram of an I-Q demodulator.

FIG. 3 is a block diagram of I-Q mixer circuit 206 for producing the in-phase and quadrature signals $V_I$ and $V_Q$ from $V_{RF}$ and $V_{LO}$ at the 10.0 megahertz IF frequency and separated in phase by 90.0 degrees. In the Figures, elements having the same reference number perform similar functions.

I-Q mixer 206 includes a phase shift circuit 113, limiting amplifiers 222 and 224, and a phase detector 226 for operating as a delay locked loop in a fashion similar to delay locked loop 100 shown and described in FIG. 1. The delay locked loop is self-calibrating, maintaining the quadrature relationship between signals $V_{PSL}$ and $V_{LOL}$ over a broad frequency range. I-Q mixer 206 further includes mixer circuits 228 and 230. $V_{LO}$ has an amplitude between 100.0 and 250.0 millivolts.

Phase shift circuit 113 introduces a phase shift in $V_{LO}$ whose magnitude is continuously adjustable by a control signal $V_{CONTROL}$ to produce a phase shifted signal $V_{ps}$. Phase shift circuit 113 has a frequency response capable of producing the quadrature phase shift over the operating frequency range of $V_{LO}$. Hence, for a broadband application such as wireless communications device 200, phase shift circuit 113 operates in a 90–1490 megahertz frequency range.

Limiting amplifiers 222 and 224 are configured with sufficient gain to produce amplitude-limited output signals $V_{PSL}$ and $V_{LOL}$, respectively, having a constant amplitude of approximately 250.0 millivolts independent of the amplitudes of $V_{LO}$ and $V_{ps}$. For example, where the smallest specified amplitude of $V_{LO}$ or $V_{PS}$ is 25.0 millivolts, limiting amplifiers 222 and 224 have respective gains of at least 250/25=10.0. Such a fixed amplitude removes amplitude variations in $V_{LO}$ and $V_{ps}$, thereby reducing system noise and improving the accuracy of the recovered information.

Limiting amplifiers 222 and 224 are matched using standard integrated circuit component matching techniques such that their respective output signals $V_{PSL}$ and $V_{LOL}$ have equal amplitudes. Matching has the further benefit of subjecting $V_{ps}$ to the same propagation delay through amplifier 222 as the propagation delay of $V_{LO}$ through amplifier 224. Hence, $V_{LOL}$ and $V_{PSL}$ have the same phase relationship as $V_{LO}$ and $V_{ps}$.

Phase detector 226 detects the phase relationship between $V_{LOL}$ and $V_{PSL}$ and produces a control signal $V_{CONTROL}$ representative of the phase difference. $V_{CONTROL}$ is applied to a control input of phase shift circuit 113 to adjust the amount by which $V_{LO}$ is phase shifted to produce $V_{PS}$. Phase detector 226 incorporates combinatorial logic such as multiplier circuits to produce a nonzero $V_{CONTROL}$ amplitude when $V_{LO}$ and $V_{ps}$ are out of quadrature. Consequently, $V_{CONTROL}$ produces a substantially zero phase adjustment through phase shift circuit 113 when $V_{LOL}$ and $V_{PSL}$ are in quadrature. Control signal $V_{CONTROL}$ adjusts phase shift circuit 113 to maintain the phase shift through phase shift circuit 113 at 90.0 degrees. For example, if $V_{LO}$ is shifted less than 90.0 degrees to produce $V_{ps}$, phase detector 226 restores the quadrature relationship of $V_{LO}$ and $V_{PS}$ by producing a nonzero $V_{CONTROL}$ whose polarity causes phase shift circuit 113 to restore the phase shift to 90.0 degrees. A similar correction is made when $V_{LO}$ is phase shifted more than 90.0 degrees through phase shift circuit 113. As a result of the phase correction of phase shift circuit 113 provided by $V_{CONTROL}$, the present invention provides I-Q mixer 206 with a self-calibrating feature that increases image rejection and improves demodulation accuracy while allowing operation over a broad frequency range.

Recall that limiting amplifiers 222 and 224 produce $V_{LOL}$ and $V_{PSL}$ with equal and constant amplitudes. Therefore, while $V_{LOL}$ and $V_{PSL}$ are derived from $V_{LO}$, which is an analog signal, $V_{LOL}$ and $V_{PSL}$ have the amplitude characteristics of a digital signal. Accordingly, phase detector 226 can be implemented using either digital or analog circuitry. In a high frequency application such as wireless communications device 200, an adequate frequency response is achieved by configuring phase detector 226 as a doubly-balanced multiplier circuit. Such a multiplier configuration produces $V_{CONTROL}$ having a component frequency of $2*V_{LO}$, which typically is removed with a low pass loop filter included in phase detector 226.

Mixers 228 and 230 are implemented as doubly balanced multiplier circuits to operate at the high frequencies of amplified carrier signal $V_{RF}$ and local oscillator signal $V_{LO}$ in wireless communications device 200. However, mixers 228 and 230 alternatively can use other types of analog or digital multipliers without departing from the principles of the present invention. As a further alternative, mixers 228 and 230 can incorporate sequential logic circuitry such as latches and logic gates to produce $V_Q$ and $V_I$.

Mixer 228 combines $V_{RF}$ with $V_{PSL}$ to produce quadrature signal $V_Q$ operating at a center frequency of $V_{RF}-V_{PS}$=10.0 megahertz. Mixer 230 combines $V_{RF}$ with $V_{LOL}$ to produce in-phase signal $V_I$ which also operates at a center frequency of $V_{RF}-V_{LOL}$=10.0 megahertz. Mixers 228 and 230 are matched such that both the modulation information present in $V_{RF}$ and the quadrature relationship of $V_{LOL}$ and $V_{PSL}$ are retained in $V_I$ and $V_Q$. It should be noted that when mixers 228 and 230 are implemented as multipliers, both the sum and difference frequencies of the respective input signals are produced as components of $V_I$ and $V_Q$. Because the sum component contains the same information as the difference component but is more difficult to process accurately owing to its high frequency, i.e., up to 2,990.0 megahertz, low pass filter circuits often are included in mixers 228 and 230 to attenuate or remove frequency components above 10.0 megahertz.

By now it should be appreciated that a circuit and method have been provided for producing a quadrature signal from an input signal. The input signal is applied to a variable phase shifting circuit consisting of two delay stages, each of which delays the input signal. The cumulative phase shift is controlled by a correction or control signal. The phase shift corresponds to the output resistance of a voltage follower. The input and quadrature signal are compared in a phase detector and a correction signal derived from this comparison provides feedback for adjusting the variable output resistance such that the relative phase of the input and quadrature signals is 90 degrees.

We claim:

1. A method for phase shifting an input signal, comprising the steps of:

conducting a first current through a first voltage follower to produce an output resistance at a first electrode of the first voltage follower;

applying the input signal to the first voltage follower to produce a second signal at the first electrode;

loading the first electrode with a first capacitance that interacts with the output resistance to phase shift the second signal; and varying the first current with a control signal to adjust a phase shift of the second signal.

2. The method of claim 1, further comprising the step of applying the second signal to a second voltage follower to produce an output signal at an output.

3. The method of claim 2, further comprising the steps of:

conducting a second current through the second voltage follower to establish an output resistance of the second voltage follower at the output; and loading the output with a second capacitance to interact with the output resistance of the second voltage follower for phase shifting the output signal.

4. The method of claim 3, further comprising a step of varying the second current with the control signal to adjust a phase shift of the output signal.

5. The method of claim 1, wherein the step of conducting a first current includes conducting the first current to an emitter of a bipolar transistor.

6. A delay locked loop circuit, comprising:

a first voltage follower having a control electrode coupled for receiving an input signal and a first electrode coupled to an output of the delay locked loop circuit;

a first capacitor coupled between the output and a power supply conductor;

a first current source responsive to a control signal for supplying a first current to the first electrode of the first voltage follower; and a phase detector having a first input coupled for receiving the input signal, a second input coupled to the output, and a phase detection terminal coupled to the first current source for providing the control signal.

7. The delay locked loop circuit of claim 6, further comprising:

a second voltage follower having a control electrode coupled for receiving the input signal and a first electrode coupled at a first node to the control electrode of the first voltage follower;

a second capacitor coupled between the first node and the power supply conductor; and a second current source coupled to the first node for conducting a second current through the second voltage follower.

8. The delay locked loop circuit of claim 7, wherein the second current source has a control electrode coupled to the phase detection terminal and responsive to the control signal for adjusting the second current.

9. The delay locked loop of claim 8, further comprising a loop filter coupled between the phase detection terminal and the first and second current sources for attenuating a frequency component of the control signal.

10. A quadrature generator, comprising:
   a phase detector having first and second inputs coupled for receiving a first input signal and a phase shifted signal, and an output for producing a control signal, where the control signal is substantially zero when the first input signal and the phase shifted signal are ninety degrees apart in phase;
   a first mixer circuit having a first input coupled to the first input of the phase detector, a second input coupled for receiving a second input signal and an output for providing an in-phase signal;
   a second mixer circuit having a first input coupled to the second input of the phase detector, a second input coupled for receiving the second input signal, and an output for producing a quadrature signal; and
   a phase shifting circuit having an input coupled for receiving the first input signal and an output for providing the phase shifted signal, where a phase shift of the phase shifted signal is determined by the control signal; and
   wherein the phase shifting circuit includes:
      a first voltage follower having a control electrode coupled for receiving the first input signal and a first electrode coupled to an output of the phase shifting circuit;
      a first capacitor coupled between the output of the phase shifting circuit and a power supply conductor;
      a first current source responsive to the control signal for supplying a first current to the first electrode of the first voltage follower.

11. The quadrature generator of claim 10, wherein the phase detector includes a multiplier for multiplying the first input signal and the delayed input signal to produce the control signal.

12. The quadrature generator of claim 11, further comprising:
   a first limiting amplifier having an input coupled for receiving the first input signal and an output coupled to the first input of the phase detector; and
   a second limiting amplifier having an input coupled for receiving the delayed input signal and an output coupled to the second input of the phase detector.

13. A wireless communications device, comprising:
   a radio frequency (RF) circuit having an input for receiving an RF carrier signal and an output for producing an amplified RF signal;
   a quadrature generator, including
      (a) a phase detector having a first input responsive to a local oscillator signal, a second input coupled for receiving a phase shifted signal, and an output for producing a control signal, where the control signal is substantially zero when the local oscillator and phase shifted signals are ninety degrees apart in phase;
      (b) a first mixer circuit having first and second inputs respectively coupled for receiving the local oscillator signal and the amplified RF signal, and an output for providing an in-phase signal operating at a difference frequency of the local oscillator and amplified RF signals;
      (c) a second mixer circuit having first and second inputs respectively coupled for receiving the phase shifted signal and the amplified RF signal, and an output for producing a quadrature signal operating at the difference frequency;
      (d) a phase shifting circuit operating in response to the control signal for inducing the phase shift in the local oscillator signal to produce the phase shifted signal; and
      (e) a first limiting amplifier having an input coupled for receiving the local oscillator signal and an output coupled to the first inputs of the phase detector and first mixer; and
      (f) a second limiting amplifier coupled between the phase shifting circuit and the first inputs of the phase detector and second mixer.

* * * * *